(12) United States Patent
Tanaka et al.

(10) Patent No.: US 8,299,620 B2
(45) Date of Patent: Oct. 30, 2012

(54) SEMICONDUCTOR DEVICE WITH WELDED LEADS AND METHOD OF MANUFACTURING THE SAME

(75) Inventors: Takekazu Tanaka, Kawasaki (JP); Kouhei Takahashi, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 1045 days.

(21) Appl. No.: 12/163,055

(22) Filed: Jun. 27, 2008

(65) Prior Publication Data

US 2009/0008775 A1    Jan. 8, 2009

(30) Foreign Application Priority Data

Jul. 5, 2007 (JP) .................................. 2007-176829

(51) Int. Cl.
*H01L 23/48* (2006.01)
*H01L 23/52* (2006.01)
*H01L 29/40* (2006.01)

(52) U.S. Cl. ........ 257/773; 257/691; 257/692; 257/735; 257/774; 257/E23.014; 257/E23.079

(58) Field of Classification Search ................ 257/773, 257/774, 786, E21.517, E21.592, 691, 692, 257/735, E23.014, E23.079
See application file for complete search history.

(56) References Cited

U.S. PATENT DOCUMENTS

| | | | | |
|---|---|---|---|---|
| 5,124,781 A | * | 6/1992 | Tashiro | ........................ 257/759 |
| 5,306,891 A | * | 4/1994 | Fleming et al. | .......... 219/121.64 |
| 5,637,922 A | * | 6/1997 | Fillion et al. | ................... 257/728 |
| 6,307,755 B1 | * | 10/2001 | Williams et al. | .............. 361/813 |
| 6,720,642 B1 | * | 4/2004 | Joshi et al. | ..................... 257/673 |
| 6,903,450 B2 | | 6/2005 | Funato et al. | |
| 7,122,884 B2 | * | 10/2006 | Cabahug et al. | .............. 257/676 |
| 7,230,322 B2 | | 6/2007 | Funato et al. | |
| 7,364,950 B2 | | 4/2008 | Funato et al. | |
| 7,675,183 B2 | * | 3/2010 | Toyoda et al. | ................. 257/784 |
| 2002/0130114 A1 | | 9/2002 | Evers | |
| 2005/0205997 A1 | * | 9/2005 | Yamamoto et al. | ........... 257/751 |
| 2006/0231959 A1 | * | 10/2006 | Harun et al. | ................... 257/781 |
| 2007/0040186 A1 | * | 2/2007 | Fillion et al. | ................... 257/177 |
| 2007/0052075 A1 | * | 3/2007 | Funato et al. | ................. 257/676 |
| 2007/0114352 A1 | * | 5/2007 | Cruz et al. | ................. 248/316.7 |

FOREIGN PATENT DOCUMENTS

| JP | 57112050 A | * | 7/1982 |
|---|---|---|---|
| JP | 61-053737 | | 3/1986 |
| JP | 61053737 A | * | 3/1986 |
| JP | 2002-313851 A | | 10/2002 |
| JP | 2002-314018 A | | 10/2002 |
| JP | 2004-311539 A | | 11/2004 |

* cited by examiner

*Primary Examiner* — Teresa M Arroyo
(74) *Attorney, Agent, or Firm* — Foley & Lardner LLP

(57) ABSTRACT

A semiconductor device and a manufacturing method for preventing mechanical and thermal damage to the semiconductor chip. A laser beam welds a first connection pad formed on a first external lead to a first electrode formed on the surface of the semiconductor chip. A first connection hole is formed in the first connection pad, and the first connection hole overlaps the first connection electrode. A laser beam irradiates an area including the first connection hole, and the first connection pad in a portion around the first connection hole is melted to form a melting section, that is welded to the first connection electrode to easily form a semiconductor device with more excellent electrical characteristics.

2 Claims, 14 Drawing Sheets

FIG. 8

| MATERIAL | | REFLECTIVITY (%) | MELTING POINT (°C) |
|---|---|---|---|
| SILVER | Ag | 96.4 | 961 |
| GOLD | Au | 94.7 | 1063 |
| COPPER | Cu | 90.1 | 1083 |
| TANTALUM | Ta | 78.5 | 2996 |
| ALUMINUM | Al | 73.3 | 660 |
| PLATINUM | Pt | 72.9 | 1769 |
| NICKEL | Ni | 72.0 | 1453 |
| TUNGSTEN | W | 62.3 | 3410 |

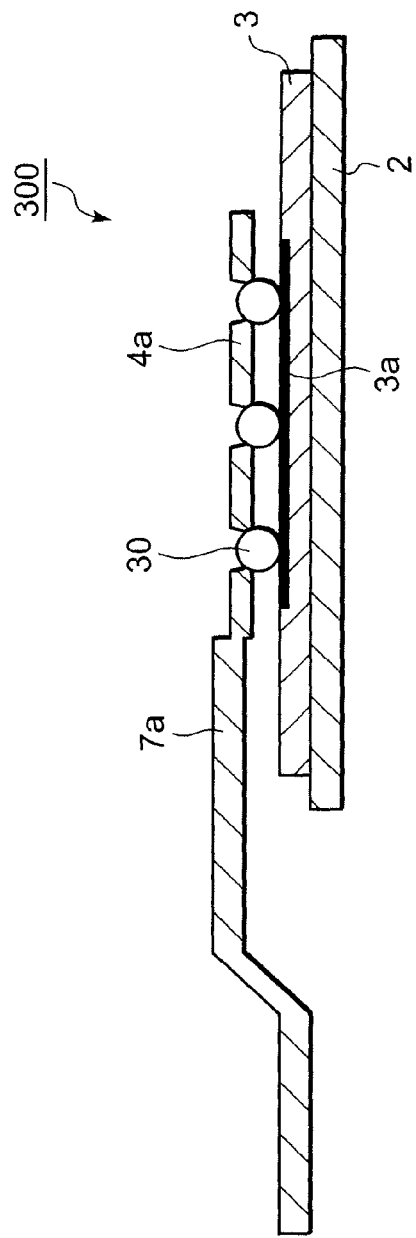
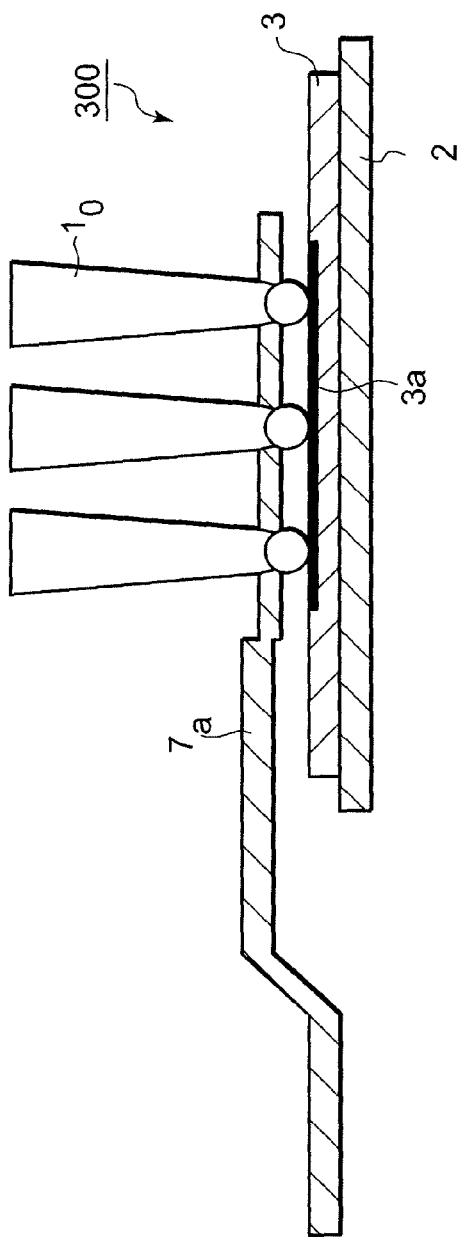

SEMICONDUCTOR DEVICE WITH WELDED LEADS AND METHOD OF MANUFACTURING THE SAME

CROSS-REFERENCE TO RELATED APPLICATIONS

This application is based upon, claims the benefit of priority of, and incorporates by reference the contents of Japanese Patent Application No. 2007-176829 filed on Jul. 5, 2007.

BACKGROUND

1. Field of the Invention

The present invention relates to a semiconductor device and a manufacturing method, and relates in particular to a semiconductor device and a manufacturing method where external leads are welded to the electrodes of a semiconductor chip.

2. Description of Related Art

Metal-Oxide-Semiconductor Field-Effect Transistors (MOSFETs) utilized in power supplies for consumer electronic products such as cell phones, personal computers, and digital audio-visual equipment or for driving vehicle motors carry a large current of approximately 1 to 200 A. This heavy current requires using a thick external wire with a large cross sectional area. Therefore in order to draw a large current, multiple large gage bonding wires of about 100 to 500 μm are connected as external wires to a MOSFET source electrode.

Bonding wires are typically connected by ultrasonic bonding or thermocompression bonding to the source electrode. This bonding connection requires an area of about 1.5 to 3 times the cross sectional area of the wire. The source electrode or gate electrode however is limited to a small area so there is a limit on how far the wire cross sectional area can be enlarged. Moreover the large wire cross sectional wire requires a higher application of pressure to obtain the required larger bonding strength and that mechanical impact causes damage to the semiconductor chip. The loop in the large-gage bonding wires also causes lower productivity.

To address these problems, the Japanese Unexamined Patent Application Publication Nos. 2002-313851 (Oono et al.) and 2002-314018 (Funato et al.) utilize a flat-plate electric member as an external wire instead of a bonding wire and to enlarge the cross sectional area of the external wire. FIG. 1 is an external perspective view of the SOP (Small Outline Package) disclosed in Ono et al. FIG. 2A is a horizontal cross sectional view taken along lines A-A of FIG. 1. FIG. 2B is a vertical cross sectional view taken along lines B-B of FIG. 1.

The semiconductor device 101 in FIGS. 2A and 2B includes a molding resin 102. A source electrode 104a and a gate electrode 104g are forming on the top surface of the semiconductor chip 105, and a drain electrode (not shown) is formed on the underside of semiconductor chip 105.

Among the eight external leads, four drain-side terminals 103d are integrated into one set to form drain-side post 107d inside the molding resin 102. The semiconductor chip 105 is placed above the drain-side post 107d such that the drain-side post 107d is electrically connected with the drain electrode (not shown). Among the remaining four external leads, three source-side terminals 103s are integrated into one set to form a source-side post 107s within the molding resin 102, and one gate-side terminal 103g forms a gate-side post 107g within the molding resin 102.

The source-side post 107s and the source electrode 104s are electrically connected by an electric path member 106. An electrode-side connecting portion 106a formed at one end of the electric path member 106 and source electrode 104s; and a lead-side connecting portion 106d formed at the other end of the electric path member 106 and source side post 107s are connected directly to each other by ultrasonic bonding. Utilizing the flat plate electric path member 106 allows making the cross sectional area of the path for current flowing between the source-side post 107s and the source electrode 104s significantly larger than the path for current flowing through the multiple bonding wires. The gate-side post 107g is electrically connected by one bonding wire 108 to the gate electrode 104g.

A bonding technique for wire bonding utilizing a laser is disclosed in Japanese Unexamined Patent Application Publication No. SH061-53737 (FIG. 2) (Matsuda et al). FIG. 3 is a cross sectional view showing a semiconductor device disclosed in Matsuda et al. A semiconductor chip 201 is placed on a die pad (islands) 203 of a lead frame. An electrode pad 202 placed on the semiconductor chip 201 and a lead 204 of the lead frame are electrically connected by a bonding wire 205. Laser welding connects the electrode pad 202 and the wire 205.

However, the ultrasonic bonding process disclosed by Oono et al. and Funato et al. may cause mechanical damage to the semiconductor chip due to ultrasonic vibration. Moreover bonding to some metals is difficult because the process is a mechanical bonding process.

Specifically the step of mounting a semiconductor chip on a die pad (island) of a lead frame is carrier out at a temperature of 300 degrees C. or higher and an oxide film is consequently formed on the surface of the semiconductor chip electrode. In order to make a mechanical bond between the external wire and the electrode at a low temperature, the oxide film on the electrode surface must be stripped away to expose a new surface. These actions require applying an ultrasonic vibration to the external wire and the electrode that were placed in contact with each other. However if the external wire has a large cross sectional area then a large mechanical impact is applied to the electrode due vibration of the external wire, and convey the mechanical damage to the semiconductor chip under the electrode. The MOSFET product is a product especially vulnerable to breakdown since there is an active cell directly under the electrode. Moreover, the bonding is difficult when there is a material such as copper (Cu) with a thick surface oxide film.

The laser bonding process disclosed by Masuda et al. on the other hand, might cause thermal damage to the semiconductor device under the electrode. Large diameter wires of about 100 to 500 μm or more are used to lower the on-resistance to allow the MOSFET to carry larger current. This current corresponds to a thickness of 100 to 500 μm. The thickness of the electrodes on other hand may be as small as 2 to 6 μm as described in Oono et al. Adjusting the laser intensity is extremely difficult when laser-welding members having significantly different thicknesses because a high laser intensity might thermally damage the semiconductor device, and a low laser intensity might fail to make the connection or make only a weak connection.

SUMMARY

The features of the present invention are described next using the numbers and reference numerals utilized in the Detailed Description of the Preferred Embodiments. These numbers and reference numerals are shown in parentheses in order to clarify the corresponding relation between the description in the Claims and the Detailed Description of the Preferred Embodiments. However, these numbers and reference numerals are not utilized in the description of the technical range of the invention described in the claims.

One aspect of the invention is a semiconductor device where a first semiconductor pad (4a) of a first external lead (7a) is welded to a first connection electrode (3a) formed on a top surface of a semiconductor chip (3). A first connection hole (5a) is formed in the first connection pad (4a). The first connection hole (5a) overlaps the first connection electrode (3a), and a melting section (9) of the first connection pad (4a) is welded to the first connection electrode (3a) in a portion around the first connection hole (5a).

Another aspect of the invention is a method for laser welding a first connection pad (4a) of a first external lead (7a) to a first connection electrode (3a) formed on a top surface of a semiconductor chip (3). A first connection hole (5a) is overlapped with the first connection electrode (3a), and a laser beam (10) is irradiated onto an area including the first connection hole (5a). The first connection pad (4a) melts in a portion around the first connection hole (5a), and is welded to the first connection electrode (3a).

The present invention provides a semiconductor device manufacturing method capable of preventing mechanical and thermal damage to the semiconductor device while also providing high reliability and productivity.

BRIEF DESCRIPTION OF THE DRAWINGS

The above and other objects, advantages and features of the present invention will become more apparent from the following description of the preferred embodiments taken in conjunction with the accompanying drawings, in which:

FIG. 8 is a table comparing the melting points and reflectivity rates for each type of metal;

FIG. 13A is a cross sectional view showing the method for manufacturing a semiconductor device 300 for the third embodiment of the present invention;

FIG. 13B is a cross sectional view showing the method for manufacturing a semiconductor device 300 for the third embodiment of the present invention;

DETAILED DESCRIPTION OF THE PREFERRED EMBODIMENTS

Figure 1:
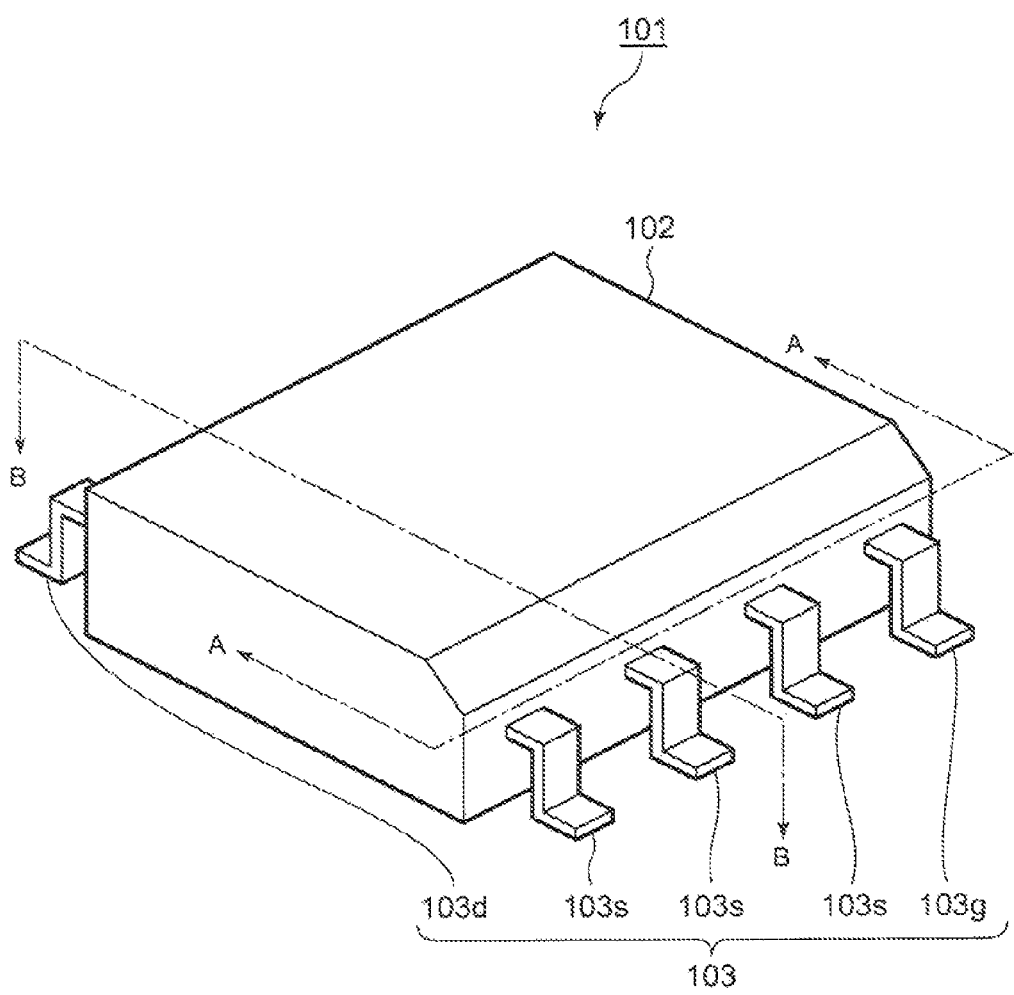
FIG. 1 is an external perspective view of the semiconductor device 101 of the prior art.
Figure 2A:
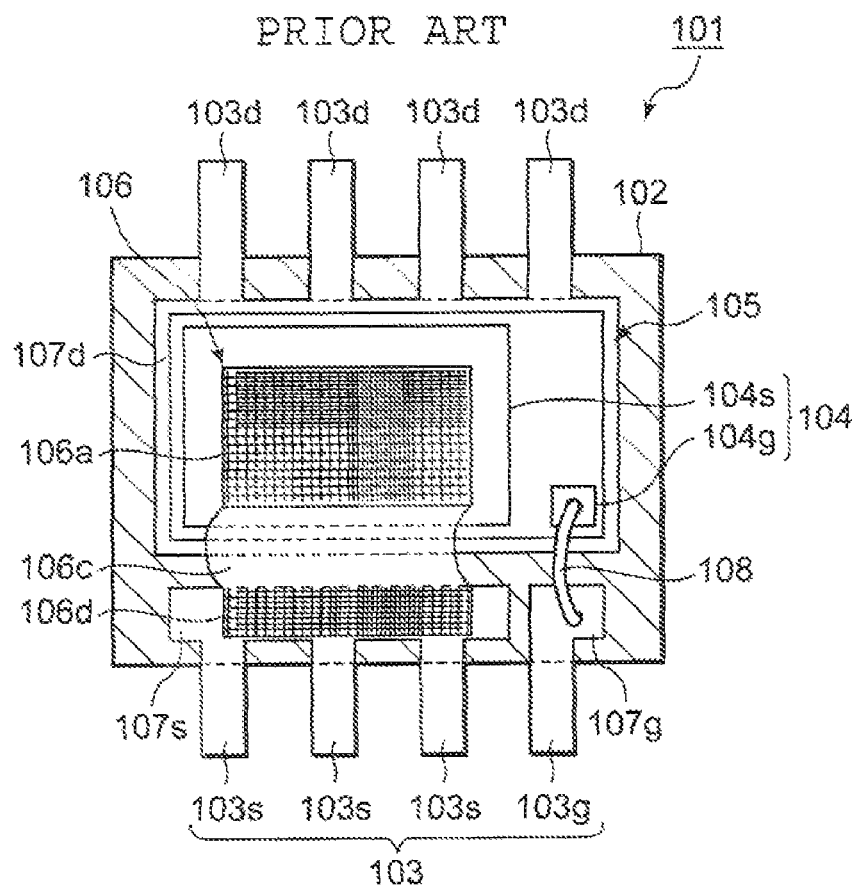
FIG. 2A is a horizontal cross sectional view taken along lines A-A of FIG. 1.
Figure 2B:
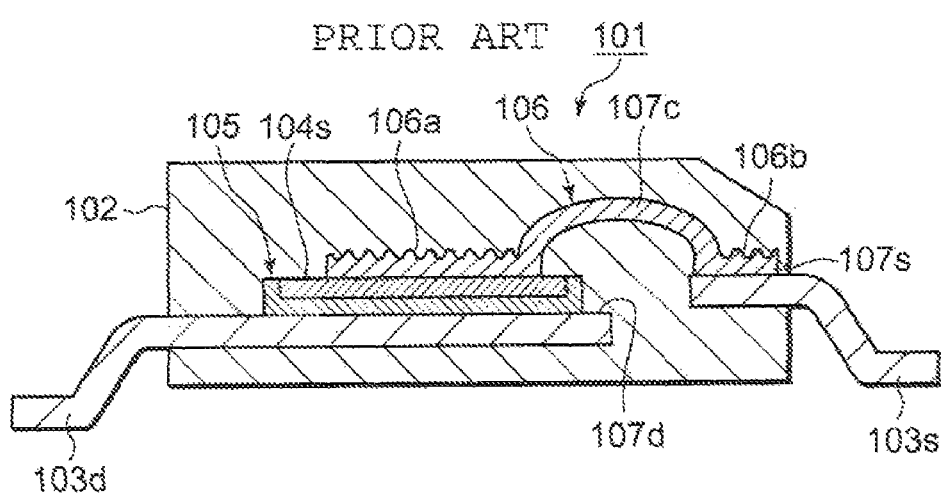
FIG. 2B is a vertical cross sectional view taken along lines B-B of FIG. 1.
Figure 3:
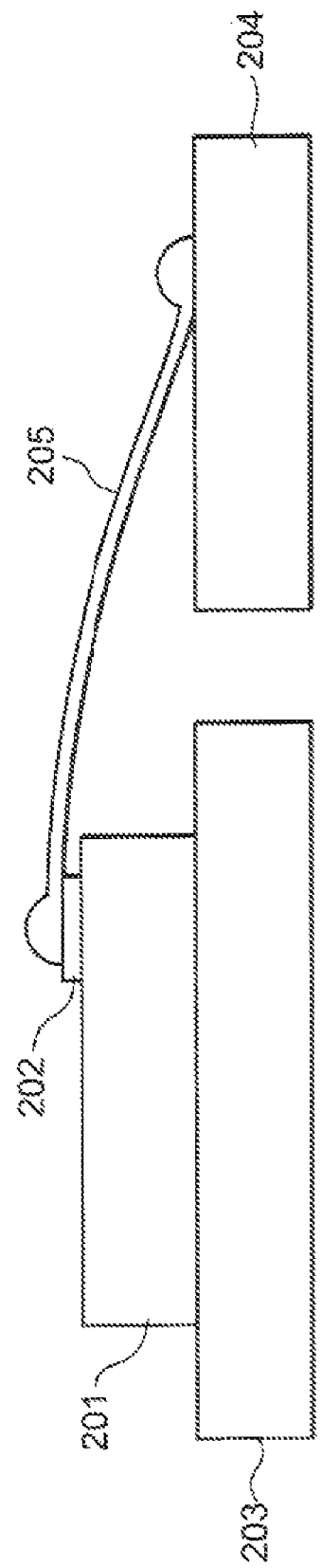
FIG. 3 is a cross sectional view of another semiconductor device of the prior art.

The invention will next be described with reference to the illustrative embodiments. Those skilled in the art will recognize that many alternative embodiments can be accomplished using the knowledge of the present invention and that the invention is not limited to the embodiments illustrated for explanatory purposes. The following description and the attached drawings are appropriately simplified to clarify the description.

First Embodiment

A first embodiment of the present invention is described next while referring to the drawings. In the first embodiment, this invention is applied to a semiconductor device where a number of MOSFET cells are combined into one MOSFET for larger current and lower on-resistance uses. While a single transistor cell normally carries a current of approximately 0.1 amperes, a combined transistor of this type can carry a current from about 1 to 200 amperes and may be used for power supplies in consumer electronics products or driving of vehicle motors, etc.

Figure 4A:
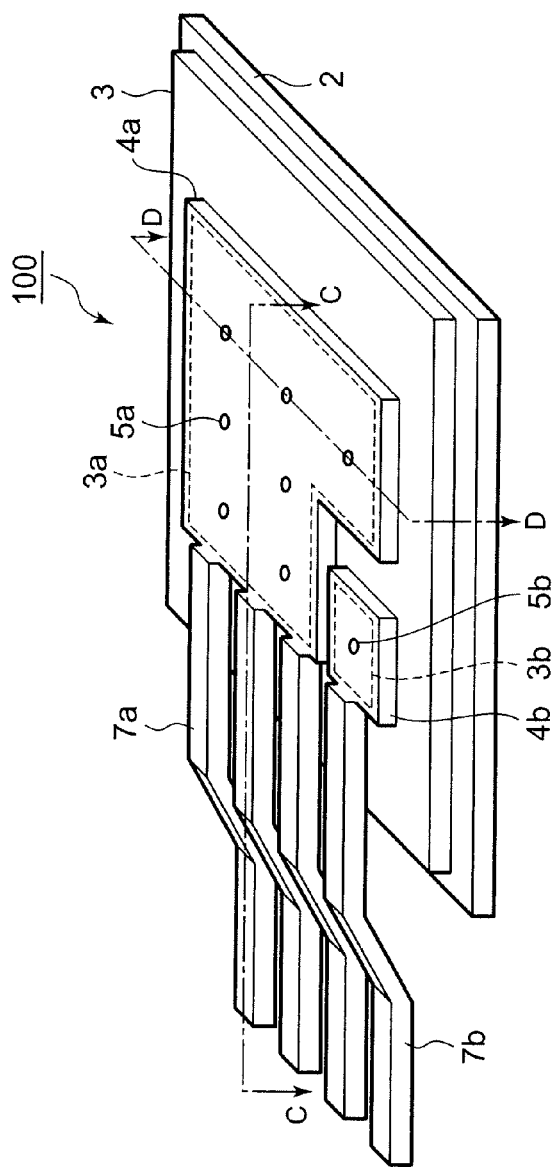
FIG. 4A is a perspective view showing the semiconductor device 100 applied to the first embodiment of the present invention.
Figure 4B:
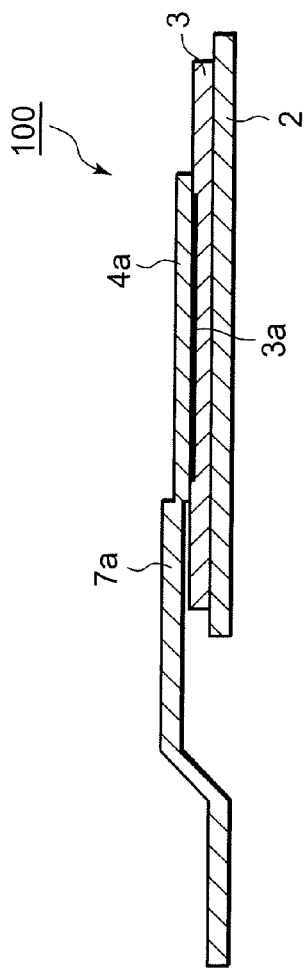
FIG. 4B is a cross sectional view taken along lines C-C of FIG. 4A.
Figure 5:
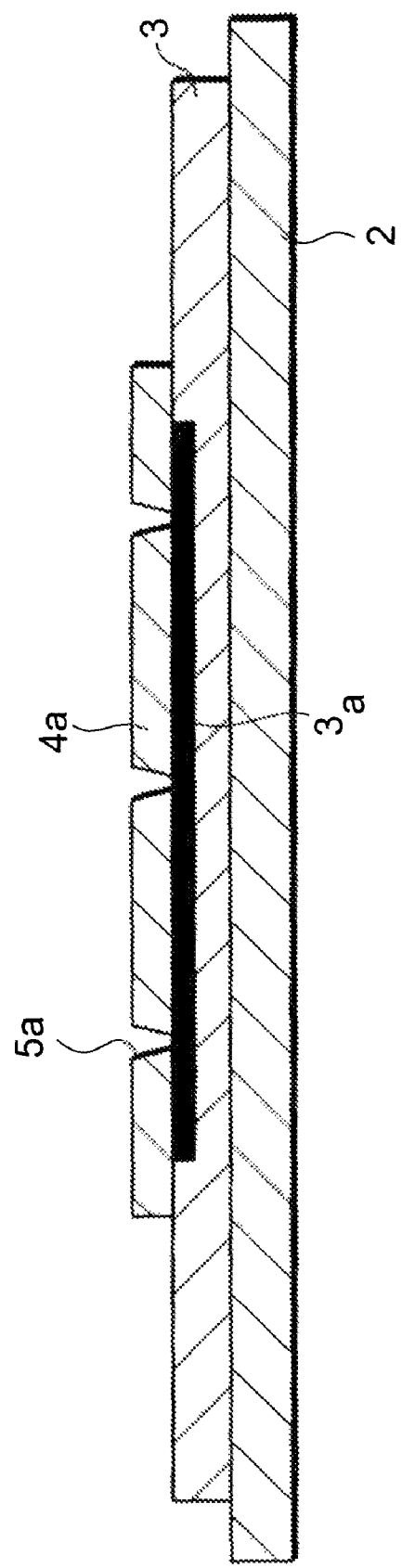
FIG. 5 is a cross sectional view taken along lines D-D of FIG. 4A.

FIG. 4A is a perspective view showing a semiconductor device 100 applied to the first embodiment. FIG. 4B is a cross sectional view taken along lines C-C of FIG. 4A. FIG. 5 is a cross sectional view taken along lines D-D of FIG. 4A. The semiconductor device 100 as shown in FIG. 4A, FIG. 4B and FIG. 5 includes a lead frame die pad (island) 2, a semiconductor chip (die) 3, a source electrode 3a (first connection electrode), a source lead 7a (first external lead). The semiconductor chip 3 is mounted onto the die pad 2 with a conductive paste. A source pad 4a (first connection pad) for electrically connecting to the source electrode 3a is formed on the source lead 7a. A plurality of first connection holes 5a are formed in the source pad 4a. The semiconductor device 100 further contains a gate electrode 3b (second connection electrode) and a gate lead 7b (second external lead). A gate pad 4b (second connection pad) for electrically connecting to the gate electrode 3b is formed on the gate lead 7b. A third connection hole 5b is formed in the gate pad 4b.

Figure 6A:
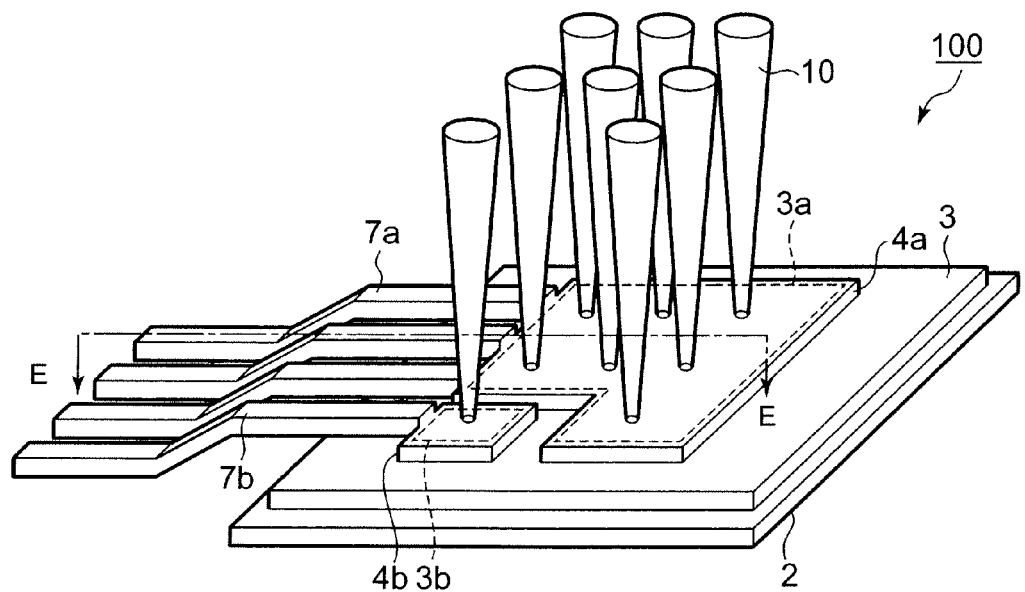
FIG. 6A is a perspective view showing the method for manufacturing the semiconductor device 100.
Figure 6B:
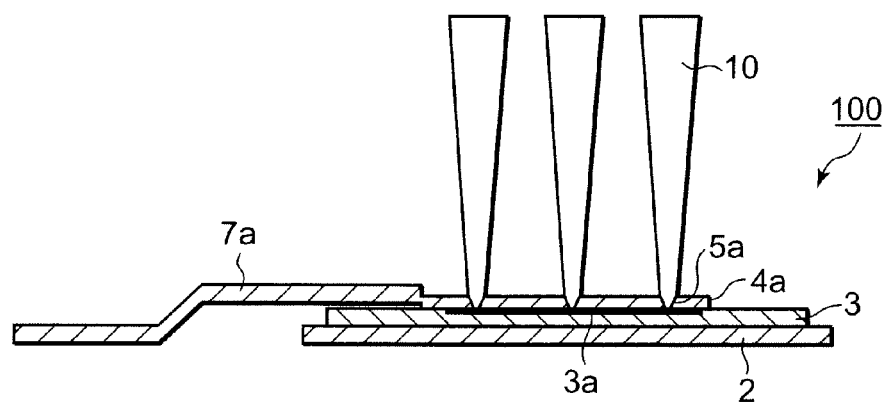
FIG. 6B is a cross sectional view taken along lines E-E of FIG. 6A.

FIG. 6A is a perspective view showing the method for manufacturing the semiconductor device 100. FIG. 6B is a cross sectional view taken along lines E-E of FIG. 6A. Laser beams 10 are irradiated from a laser irradiation device (not shown in drawing) onto the semiconductor device 100. The laser beam 10 is irradiated while focused onto an area including the respective first connection hole 5a and does not irradiate onto other areas. The laser beam 10 melts a portion of the first connection pad 4a in the portion around the first connection hole 5a and forms a welded zone to the first connection electrode 3a. Except for the tip portion (portion connecting to the mounting substrate) of the external lead, all of the structural elements are then sealed in epoxy resin and a package formed (not shown in drawing).

Figure 7:
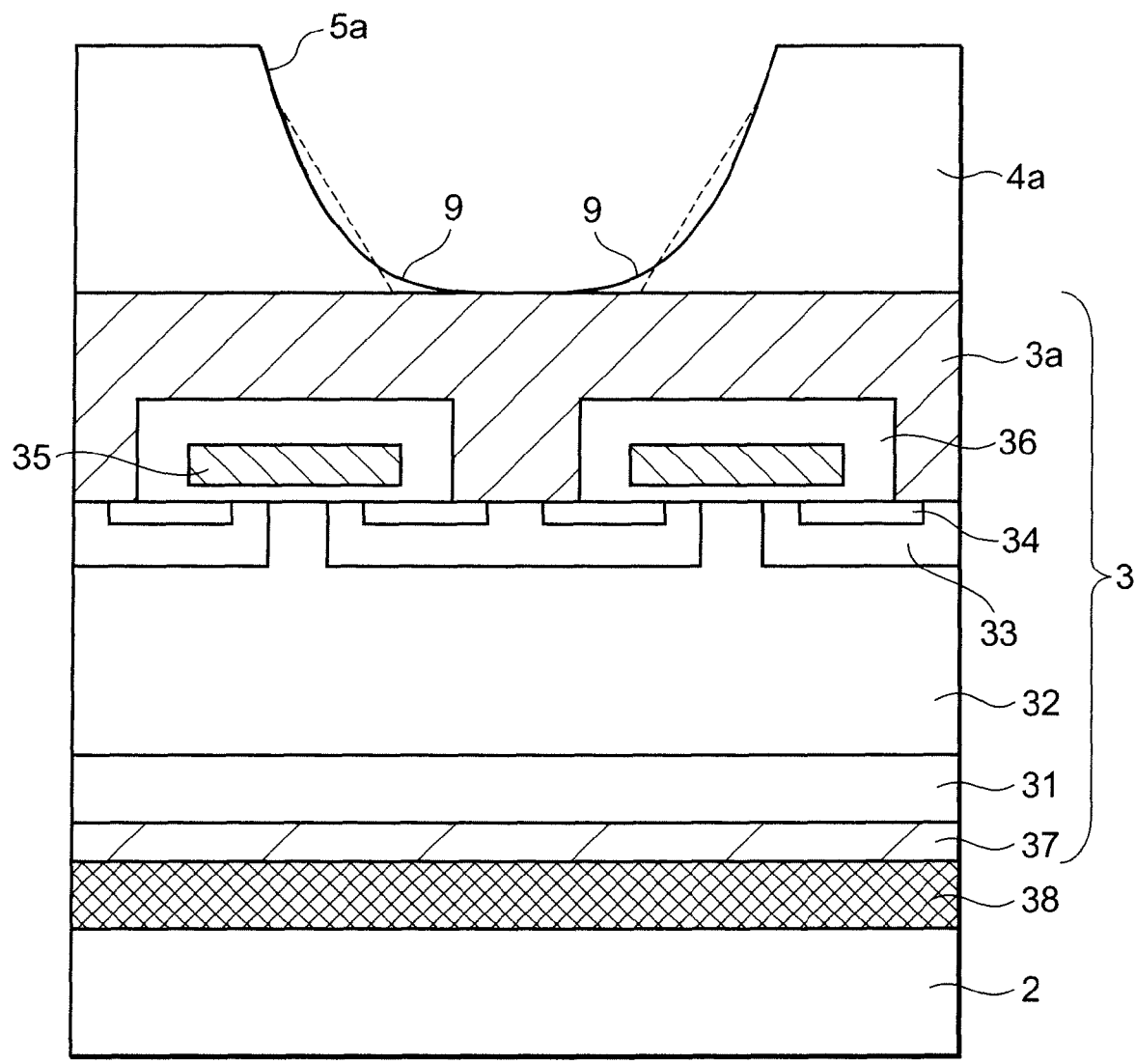
FIG. 7 is an enlarged cross sectional view of a portion around the welded zone of the semiconductor device 100.

FIG. 7 is a cross sectional view of the portion around the welded zone. As shown in FIG. 4A and FIG. 4B, the source pad 4a connects to the source lead 7a. The scale and dimensions for each part differ from the actual semiconductor device. A vertical MOSFET is for example formed in the semiconductor chip 3. A drain electrode 37 formed on the rear surface of the $n^+$ type drain region 31 is electrically connected to the die pad 2 by the conductive paste 38. A drain lead (third external lead: not shown in drawing) extends from the die pad 2, and electrically connects to the drain electrode 37 of semiconductor chip 3. An n type drift region 32 is formed on the $n^+$ type drain region 31, and multiple p type base regions 33 are formed in the upper side of that n type drift region 32. An $n^+$ type source region 34 is formed in the upper side of the p type base regions 33. A portion of the p type base region 33 sandwiched between the $n^+$ type source region 34 and n type drift region 32 forms a channel region of the vertical MOSFET. A gate electrode 35 is formed by way of a gate insulation film on the upper portion of the channel region. The gate electrodes 35 are mutually connected (not shown in drawings), and electrically connect to the gate electrode 3b shown in FIG. 4A. An interlayer insulation film 36 for covering the gate electrode is formed with an opening exposing a portion of the p type base region 33 and the $n^+$ type source region 34. The source electrode 3a is formed on the interlayer insulation film 36, and connects electrically to the exposed portion of the p type base region 33 and the $n^+$ type source region 34.

The source pad 4a overlaps the source electrode 3a. The first connection hole 5a is formed in the source pad 4a. The laser beam 10 irradiates onto the area on the top of the source electrode 3a and the source pad 4a including the first connection hole 5a, and a portion of the source pad 4a melts the inner portion of the first connection hole 5a to form a melting section 9, that welds to the source electrode 3a. The dotted line shows the shape of the first connection hole 5a before welding by the laser, and the solid line shows the shape of the first connection hole 5a after being welded by the laser beam.

The inventors realized that damage to the semiconductor chip 3 could be prevented even further by suppressing the melting of the source electrode 3a, and promoting the melting of the source pad 4a. Often used materials for the source electrode 3a are aluminum (Al), Cu, nickel (Ni), gold (Au), silver (Ag), platinum (Pt), tungsten (W) and/or tantalum (Ta). In contrast, Cu and Au are the main materials often used for the source pad 4a. The material utilized here is base material of Cu or Al overlaid on the surface with Ni plating, Ag plating and/or Au plating, or a Cu—Ni cladding material obtained by overlapping Ni plate on the Cu plate and then rolling the metal.

The inventors first of all took note of the reflectivity rate of these materials versus laser light. After comparing the reflectivity rates of Al, Cu, Ni, Au, Ag, Pt, W and Ta, the inventors set these in the order of high reflectivity rate as Ag>Au>Cu>Ta>Al>Pt>Ni>W. The laser light absorption efficiency becomes larger as the reflectivity rate decreases. The reflectivity rate of the electrode material of source electrode 3a should in other words be selected for a combination that yields a reflectivity rate higher than the material of the source pad 4. If using Al in the source pad 4a, then Ag, Au, Cu and Ta can be selected for the source electrode 3a, and if using Cu in the source pad 4a, then Ag and Au can be selected for the source electrode 3a.

Figure 9:
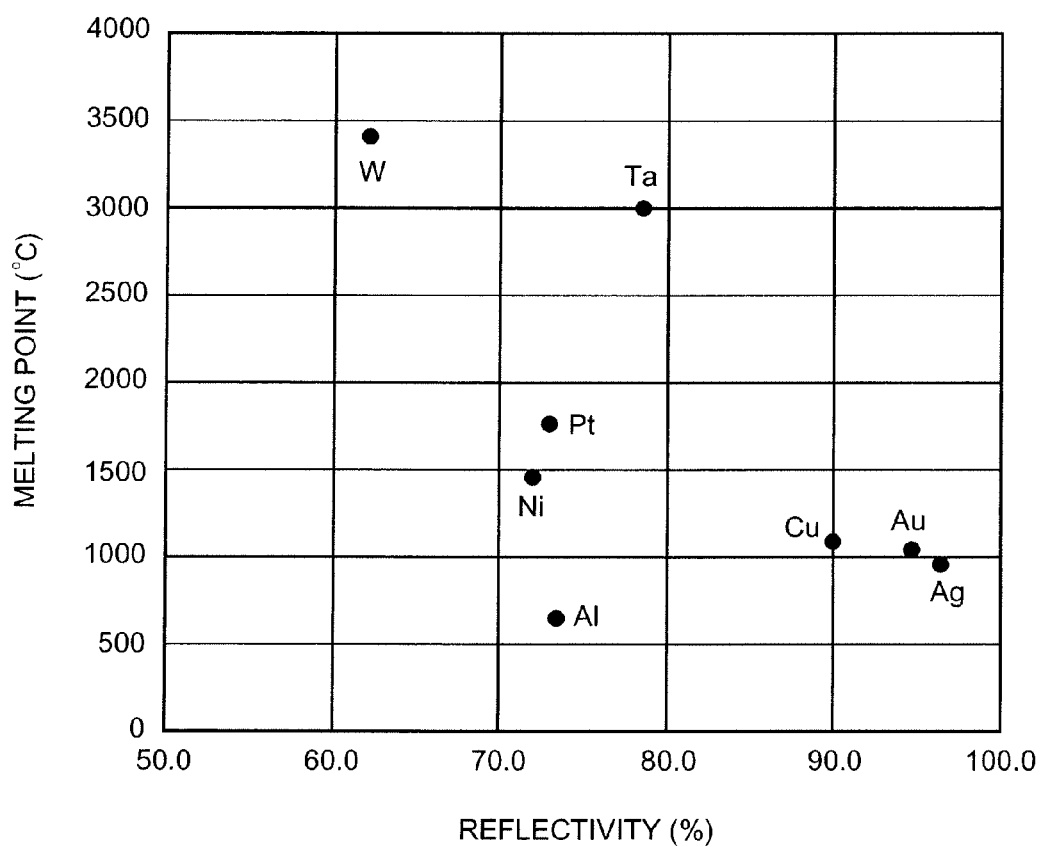
FIG. 9 is a graph showing the relation between the melting point and the reflectivity rate for each of the metals shown in FIG. 8.

However, selecting material based only on the reflectivity rate limits the material selection range. The inventors here focused on the melting point. The reflectivity rate is low in metals with high melting points such as W, Ta and Pt, yet the material melting point is drastically higher than other materials so that other materials will melt first. Therefore even in Cu is utilized in the source pad 4a, W, Ta and Pt can be utilized in the electrode material for source electrode 3a. In other words, a combination of materials should be selected so that the material of the source pad 4a melts before the material of the source electrode 3a melts. FIG. 9 shows the graph showing the relation between the melting point and the reflectivity rate for each of the metals shown in FIG. 8.

If there is a large difference in melting points then the effect due to the difference in reflectivity rates will be small so many combinations can be selected. If the difference in melting points is small then a combination with a large difference in reflectivity rates should be selected. If the material for source pad 4a is Al then both the reflectivity rate and melting point are minimal so Cu, Au, Ag, Ni, Pt, W and Ta can be utilized as the electrode material for the source electrode 3a. If the material for the source pad 4a is Cu, then Ni, Pt, W and Ta can be utilized as the electrode material for the source electrode 3a. When using Au and/or Ag with a low melting point and reflectivity rate higher than Cu as the electrode material for the source electrode 3a, then fine control of the laser beam is required in order to melt the Cu without melting the Au and/or Ag. Or the Au and/or Ag must be thickened, then controlling the laser so as not to melt the lower layer portion of the source electrode 3a even though the surface portion thereof is melted.

Figure 10:
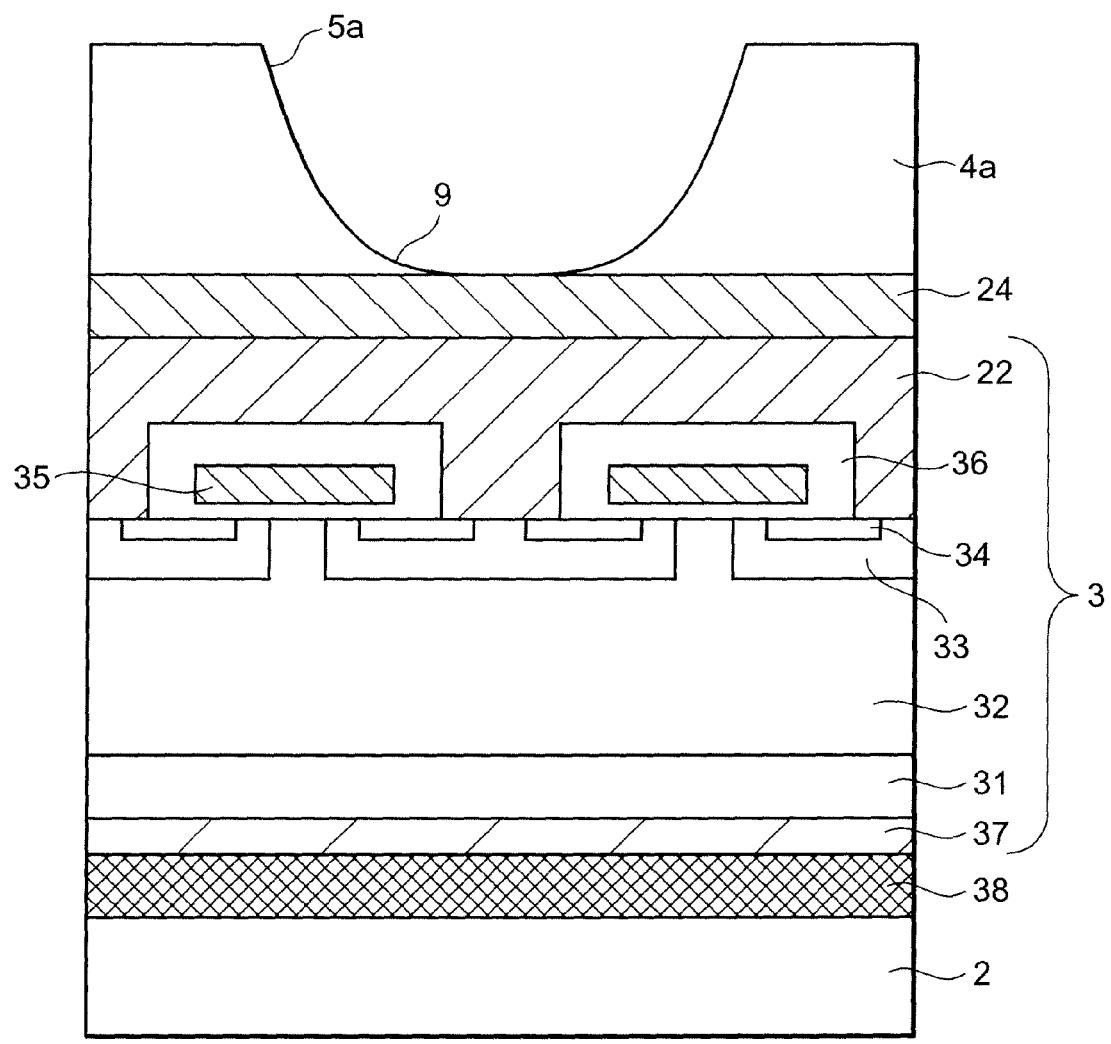
FIG. 10 is an enlarged cross sectional view of a portion of the first connection hole 5a for a variation of the semiconductor device 100.

In the vertical MOSFET, the MOSFET cells are formed directly beneath the source electrode 3a, so in order to prevent problems such as fluctuations in device characteristics due to heat propagating to the MOSFET cells during welding, the source electrode 3a may be formed to a thickness of approximately 5 μm. Materials such as Pt, W and Ta cannot easily be formed to such a thickness so after forming the Al and/or Cu forming the underlayer 22 to several μm, a laminated structure of several hundred nm of W, Ta and/or Pt may be formed as a melt prevention layer 24 as shown in FIG. 10. This melt prevention layer 24 on the surface of the source electrode 22 suppresses melting of the source electrode 22 even in a state where the source pad 4a material has melted.

Figure 11A:
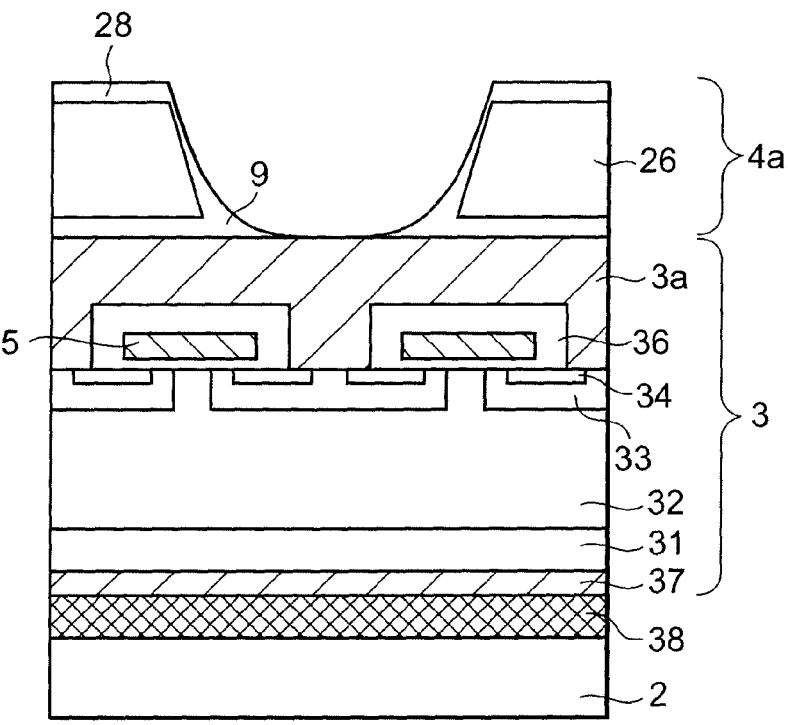
FIG. 11A is an enlarged cross sectional view of a portion of the first connection hole 5a in another variation of the semiconductor device 100.
Figure 11B:
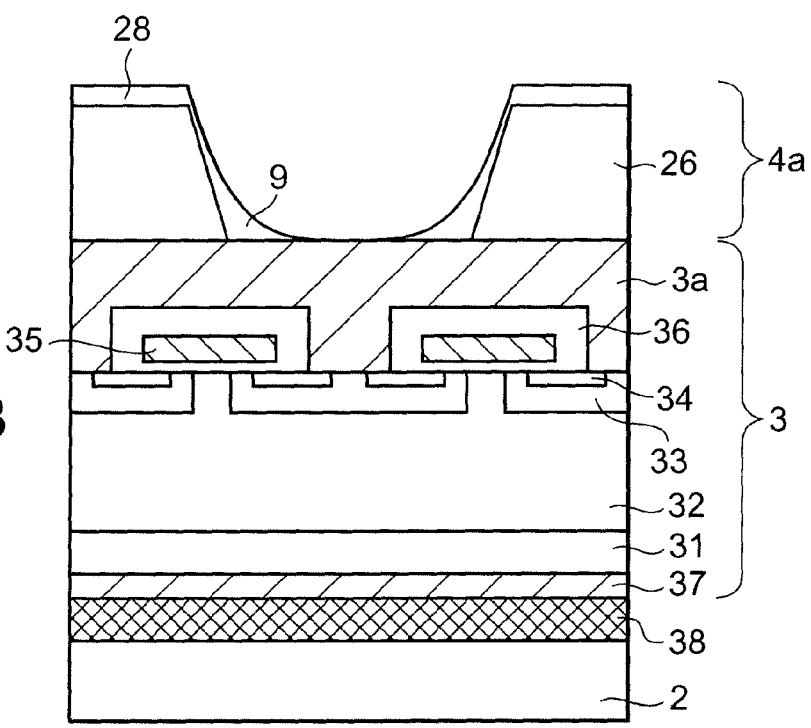
FIG. 11B is an enlarged cross sectional view of a portion of the first connection hole 5a in another variation of the semiconductor device 100.

A material that easily melts may be formed on the surface of the source pad 4a in order to melt a portion of the source pad 4a before the electrode material of the source electrode 3a. FIG. 11A shows an example of a source pad 4a where a melt accelerator layer 28 is formed on the surface of the base material 26. If Cu, for example, is the electrode material in the source electrode 3a, then Al is ideal as a material for the source pad 4a, however if Cu is utilized as the base material 26 then a plating of Al may also be utilized as the melt accelerator layer 28. If the melt accelerator layer 28 is formed then materials that are currently widely used in the lead frame can be used in the base material 26, for example Al material, Cu material, the material formed with Ni plating and/or Ag plating on the surface of the base material made of Cu and/or Al, Cu—Ni cladding material, etc. The melt accelerator layer 28 may be formed to have an amount (thickness) sufficient to weld the melted source pad 4a to the source electrode 3a at the specified strength, and is sufficient if the melt accelerator layer 28 is formed in a portion around the first connection hole 5a where the laser light is to be irradiated. The melt accelerator layer 28 may be formed on both sides of the base material 26 as shown in FIG. 11A, or may be formed just on the side irradiated by the laser light as shown in FIG. 11B.

As described above, a combination of materials for forming on the surface of the first connection electrode (source electrode 3a) and the part of the first connection pad (source pad 4a) to be melted should be considered that will be an ideal combination for the laser welding. Namely, a combination should be selected that includes a material that melts easily when irradiated by laser light for the first connection pad (source pad 4a), and a material that does not easily melt when irradiated by laser light for the first connection electrode (source electrode 3a). Therefore if the material of the first connection pad is more difficult to melt than the material of the first connection electrode, then the melt prevention layer 24 may be formed on the surface of the first connection electrode that is harder to melt than the surface of the first connection pad, or the melt accelerator layer 28 that melts easier than the surface of the first connection electrode may be formed on the surface of the first connection pad. Using a combination of melt prevention layer 24 and melt accelerator layer 28 will further improve the laser weld condition.

The first connection hole 5a can be utilized to observe the weld state of the source pad 4a and the state of the source electrode 3a, and control the laser beam. Moreover, the melting section 9 widens to the inner side of the first connection hole 5a which is effective for obtaining a sufficient area to form the welded zone, and yielding sufficient weld strength. The first connection hole 5a can also be utilized to align the source pad 4a and source electrode 3a positions.

A large current flows with small electrical resistance flows in the source pad 4a so its thickness ranges from approximately several dozen to several hundred micrometers. If no connection hole 5a was formed, then the thick source pad 4a must be melted to make a weld connection to the source electrode 3a. However, there is the problem that even with good laser light absorption efficiency, the MOSFET cells directly below the source electrode 3a might also be melted at the instant when welding this type of thick source pad 4a to the source electrode 3a. By forming the first connection hole 5a, the tip of the first connection hole 5a on the source pad 4a can easily start to melt, and a weld connection made so there is no need to melt the entire plate thickness of the source pad 4a. The first connection hole 5a may be formed in a perpendicular wall shape but if formed in a thin, pointed shape with a tapered tip, then the portion with that thin pointed tip will reach the melting temperature faster than the thick portion. Also the melting of the tip portion will gradually progress towards the thick portion so that the laser weld can be easily made while controlling the molten state. If no connection hole 5a was formed then the state of the source electrode 3a cannot be checked so making the connection while controlling the laser beam so as not to melt the source electrode 3a is difficult. However the state of the source pad 4a can be controlled while check the state of the source electrode 3a via the first connection hole 5a during the laser weld so that damage to the semiconductor chip 3 can be more prevented.

The gate electrode 3b, the gate pad 4b and the third connection hole 5b may also be made the same structure as the source electrode 3a, source pad 4a and the first connection hole 5a. The number of the connection holes 5a and 5b may be modified and changed.

In the above semiconductor device 100, a combination can be selected to allow laser welding so that the connection pad of the external lead is easier to melt with the laser light than the connection electrode on the semiconductor chip. The connection pad of the external lead and the connection electrode of the semiconductor chip can therefore be connected without damaging the semiconductor chip. Furthermore, the weld connection can be made while controlling the weld state on the external lead connection pad and checking the connection electrode state on the semiconductor chip by monitoring through the connection hole during the laser welding operation. So the laser connection can be easily made while preventing damage to the semiconductor chip.

The method for producing the semiconductor device 100 is described next. A lead frame is first prepared with the source pad 4a and the gate pad 4b respectively formed on one end of the source lead 7a and the gate lead 7b corresponding to each semiconductor chip. The lead frame allows connecting to multiple semiconductor chips. The first and third connection holes 5a and 5b are respectively formed in the source pad 4a and the gate pad 4b. The first and third connection holes 5a and 5b may be formed in a tapered shape. In the example shown in the drawing, the source pad 4a and the gate pad 4b were made thinner than the source lead 7a and the gate lead 7b however these parts may be made to the same thickness.

The semiconductor chip 3 is next mounted on the die pad 2. The source pad 4a and the gate pad 4b respectively overlap the source electrode 3a and the gate electrode 3b formed on the top side of the semiconductor chip 3. The laser beam 10 (See FIG. 6A and FIG. 6B.) is irradiated onto a respective area including the first and third connection holes 5a and 5b, each portion of the source pad 4a and the gate pad 4b then melts and forms the melting section 9 (See FIG. 7), and the source electrode 3a and the gate electrode 3b are respectively welded close to the first and third connection holes 5a and 5b. A molded resin (not shown in drawing) is then covered over the entire structure excluding the tip portions of the external leads, and completed for each semiconductor device. FIGS. 6A and 6B show examples of laser welding on all the first connection holes 5a. However, a number of the connection holes need not be laser welded if there is no problem with the weld strength or electrical characteristics.

A YAG (yttrium aluminum garnet) laser can be used as the laser beam 10. The combination of electrode material for the source electrode 3a and gate electrode 3b, and the material for the source pad 4a and the gate pad 4b is selected as described above. The spot size of the laser beam 10 may be somewhat larger than the first and third connection holes 5a and 5b. The irradiation time and beam position alignment time for the laser beam is extremely short compared to the time for mechanical bonding such as wire bonding so that production efficiency is boosted to a higher stage. The position alignment is highly accurate so that the positioning margin between the connection electrodes and the connection pads and between the connection pads can be made small, and therefore the semiconductor device can be made small.

By forming the melt prevention layer 24 on the top side of the source electrode 3a and the gate electrode 3b, and/or forming the melt accelerator layer 28 on the top side of the source pad 4a and the gate pad 4b, diverse materials can be used as the base material in the source electrode 3a and the gate electrode 3b and/or source pad 4a and gate pad 4b, the productivity can be raised and the potential range of designs for the semiconductor device can be expanded.

In the semiconductor device 100 described above, the first connection hole 5a was formed in the first connection pad (source pad 4a), and the first connection hole 5a overlapped with the first connection electrode (source electrode 3a), the laser beam 10 irradiated onto the area including the first connection hole 5a, and the melting section 9 of the first connection pad (source pad 4a) welded to the first connection electrode (source electrode 3a) in the portion around the first connection hole 5a so that mechanical damage and thermal damage to the semiconductor chip 3 is prevented, and the first external lead (source lead 7a) securely connected to the first connection electrode (source electrode 3a), and with a higher production efficiency. The productivity of the power transistors having lower on-resistance and higher current performance is remarkably increased.

The above example described a source electrode 3a, gate electrode 3b, source lead 7a, gate lead 7b, source pad 4a, gate pad 4b, first connection hole 5a, and third connection hole 5b. However, the type and number of connection electrodes, external leads, connection pads and connection holes are not limited to the above description and changes of all types can be made.

Second Embodiment

The semiconductor device 200 for the second embodiment of this invention is described next. In the following description, structural elements identical to the above described semiconductor device 100 are assigned the same reference numerals and their detailed description is omitted. In the example for the semiconductor device 100, the first and second external leads 7a and 7b and first and second connection pads 4a and 4b were made from the same material in an integrated structure, but these can be separate members. In the semiconductor device 200, first and second connection clips 11a and 11b are prepared that are formed from a member separate from the first and second external leads 14a and 14b. The first and second connection clips 11a and 11b function as the first and second connection pads 4a and 4b at one end thereof, and are connected with the first and second external leads 14a and 14b at the other end thereof, respectively.

Figure 12A:
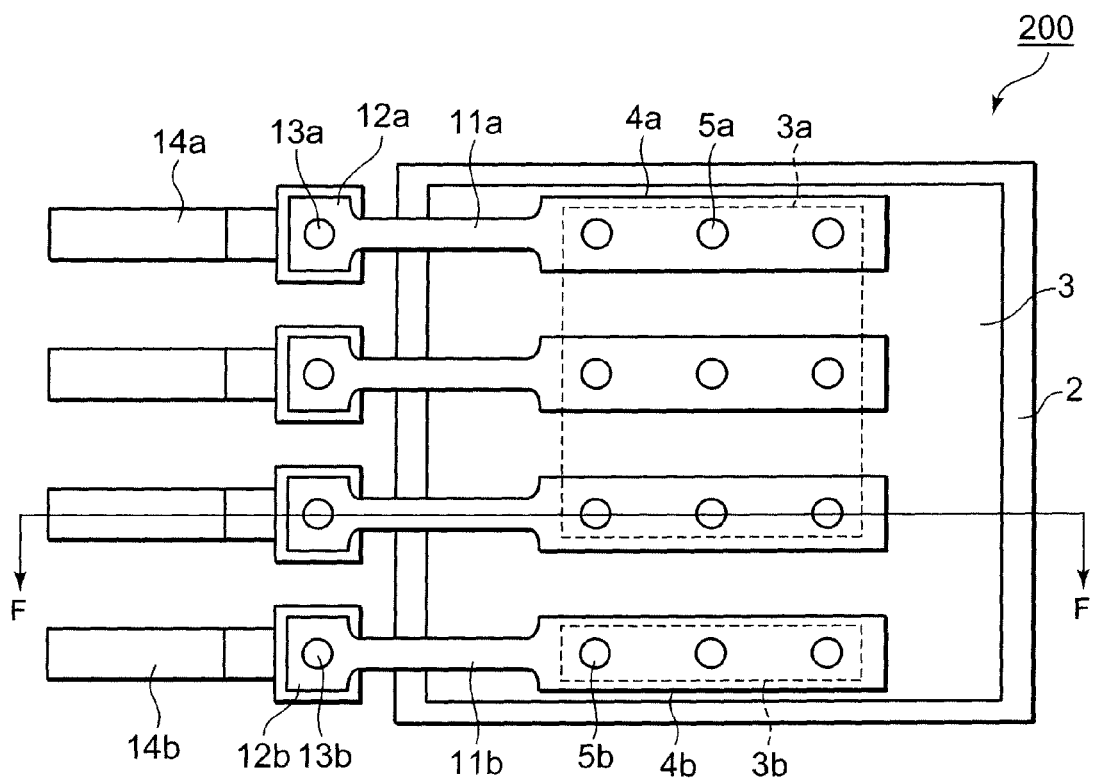
FIG. 12A is a top plan view showing the semiconductor device 200 for the second embodiment of this invention.
Figure 12B:
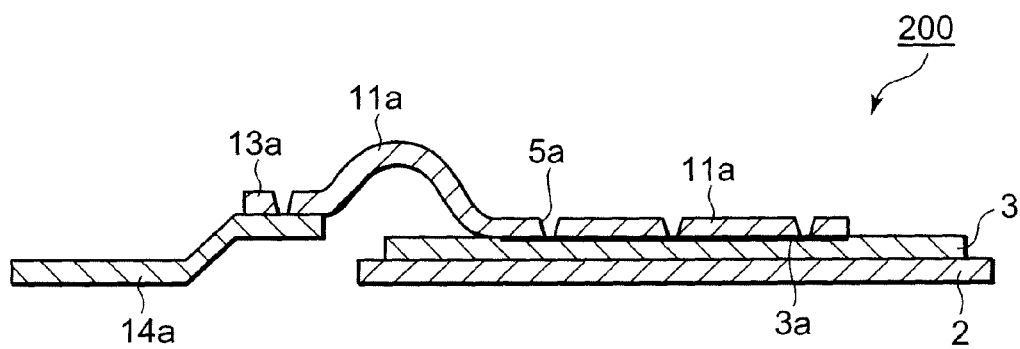
FIG. 12B is a cross sectional view taken along the lines F-F of FIG. 12A.

FIG. 12A is a top plan view showing the semiconductor device 200. FIG. 12B is a cross sectional view taken along lines F-F of FIG. 12A. The semiconductor device 200 differs from the semiconductor device 100 in that the source pad 4a (first connection pad) and the gate pad 4b (second connection pad) are respectively formed on source clip 11a (first connection clip) and a gate clip 11b (second connection clip). These components are respectively connected electrically to the source lead 14a (first external lead) and the gate lead 14b (second external lead). First connection holes 5a and third connection holes 5b are respectively formed in one ends of the source clip 11a and the gate clip 11b; and are respectively welded to the source electrode 3a and the gate electrode 3b, the same as for the semiconductor device 100. The material for the source clip 11a and the gate clip 11b, and the electrode material for the source electrode 3a and the gate electrode 3b are selected the same as the electrode material for the source electrode 3a and the gate electrode 3b for the source pad 4a and the gate pad 5b of the semiconductor device 100.

Second connection holes 13a and 13b are formed respectively on the other ends 12a and 12b of the source clip 11a and the gate clip 11b. The second connection holes 13a and 13b respectively overlap the source lead 14a and gate lead 14b, the laser beam may then irradiate an area including the second connection holes 13a and 13b, and the source clip 11a and gate clip 11b may be welded respectively to the source lead 14a and the gate lead 14b. No semiconductor chip is formed between the source clip 11a and the source lead 14a, and between the gate clip 11b and the gate lead 14b, and since the thickness of those clips and leads is approximately from several dozen to several hundred micrometers there is no need for laser irradiation conditions that are as strict as the irradiation conditions for source electrode 3a and the gate electrode 3b. The combination of materials for the source clip 11a and the source lead 14a (also for the gate clip 11b and the gate lead 14b) need not always be different materials, and the same material combination such as Cu and Cu, Al and Al may be used.

Moreover, the connection between the source lead 14a and the other end 12a of the source clip 11a (also between the gate lead 14b and the other end 12b of the gate clip 11b) is not limited to a laser connection, and may be joined by conductive paste (not shown in drawing). In that case, the second connection holes 13a and 13b are not required. Incidentally, the example in FIG. 12A, showed multiple source clips 11a respectively connected to the multiple source leads 14a, however one large source clip may be connected to multiple source leads 14a.

In the semiconductor 200, the laser beam 10 is also irradiated onto a respective area including the first and third connection holes 5a and 5b respectively formed in the source clip 11a and the gate clip 11b; and the melting sections of the source clip 11a and the gate clip 11b respectively welded to the source electrode 3a and the gate electrode 3b in the portion around the first and third connection holes 5a and 5b. Mechanical damage and thermal damage to the semiconductor chip 3 can therefore be prevented, the same as in the semiconductor device 100, and the source lead 14a and the source electrode 3a, and the gate lead 14b and the gate electrode 3b can be securely connected with higher production efficiency, respectively.

In the above described example for the semiconductor devices 100 and 200, the source electrode 3a and the source pad 4a (or the source clip 11a) are laser welded, and the gate electrode 3b and the gate pad 4b (or the gate clip 11b) are also laser welded. However though the source electrode 3a and the source pad 4a (or the source clip 11a) are connected by laser welding, the connection between the gate electrode 3b and the gate pad 4b (or the gate clip 11b) can be made by wire bonding or conductive paste without using laser welding. By applying this invention at least a first connection electrode (source electrode 3a) that passes a large electrical current can be securely connected with high production efficiency to the plate-shaped first connection pad or the plate-shaped first connection clip.

Third Embodiment

The semiconductor device 300 for the third embodiment of this invention is described next. The point where the semiconductor device 300 of this embodiment differs from the semiconductor device 100 is that the bumps 30 (bump electrode) are respectively formed on the source electrode 3a and the gate electrode 3b, and the source pad 4a and the gate pad 4b are respectively welded to the bumps 30 that is formed on the source electrode 3a, and to the bump 30 that is formed on the gate electrode 3b.

Figure 14:
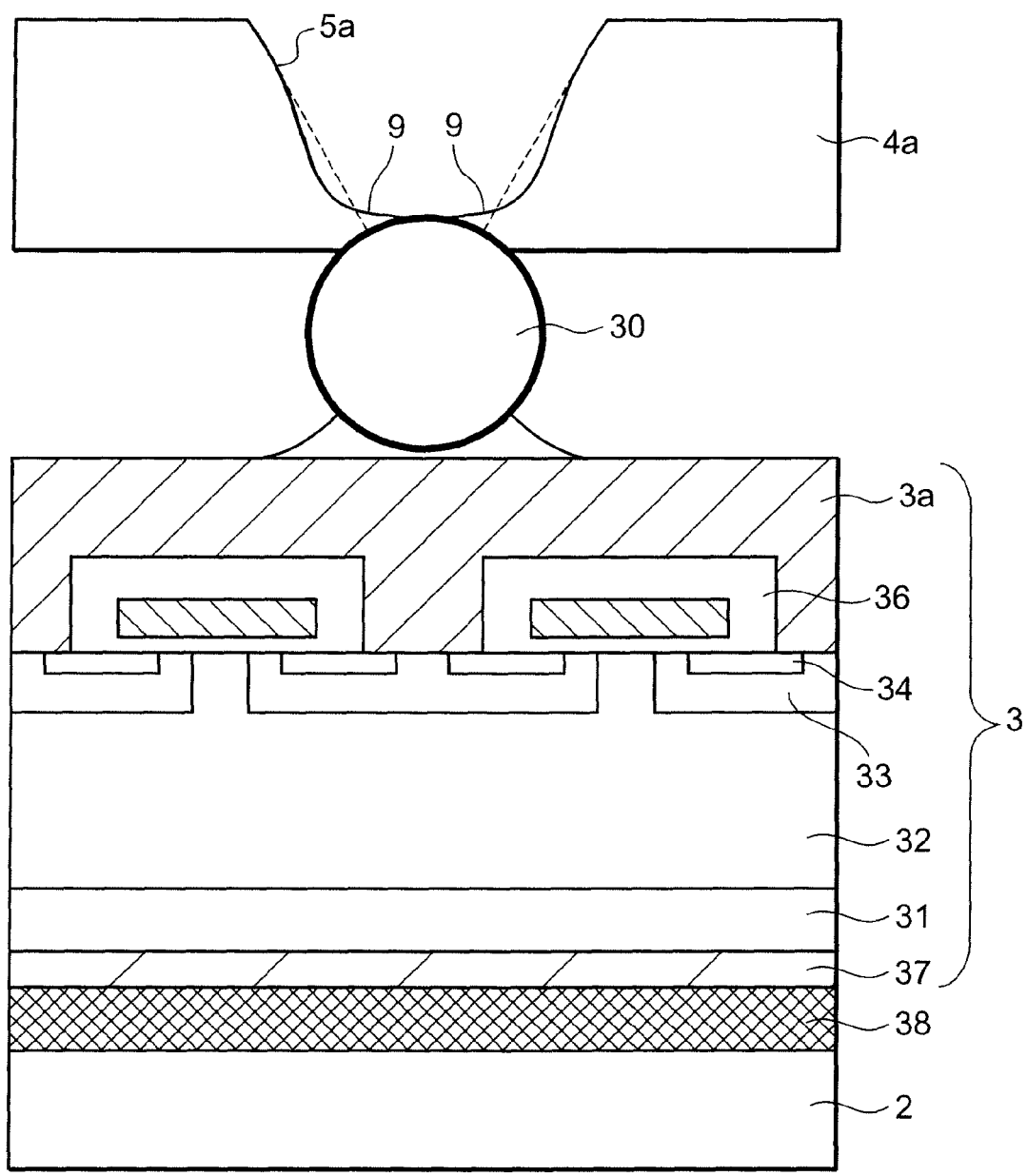
FIG. 14 is a an enlarged cross sectional view of a portion of the first connection hole 5a for the semiconductor device 300.

FIG. 13A and FIG. 13B are cross sectional views showing the process for manufacturing the semiconductor device 300. FIG. 14 is a cross sectional view showing a portion around a welded zone of the semiconductor device 300. The bumps 30 are electrically connected on the source electrode 3a as shown in FIG. 13A. Each bump 30 is a post shape or a ball shape and may utilize conductive material including Cu and/or solder containing tin (Sn). The bumps 30 are connected on the source electrode 3a by utilizing solder or a conductive adhesive, for example. After overlapping the first connection holes 5a with the bumps 30, the laser beam 10 is irradiated onto the area including the first connection holes 5a.

The melting section 9 of source pad 4a is welded to the bump 30 in the portion around the first connection hole 5a as shown in FIG. 14. In this case, the bump 30 is equivalent to the first connection electrode. The dotted line in the portion around the first connection hole 5a shows the state prior to the melting of source pad 4a. The laser beam melts the source pad 4a which melts and falls on the bump 30, and the melting section 9 forms an irregular shape.

The selection of materials for the bump 30 and the source pad 4a can be considered as described above. The bump 30 may be formed from a single conductive material, or a melt prevention layer may be formed on the surface of the base material. The melt prevention layer is a conductive material that does not melt when the source pad 4a has started to melt.

The bump 30 can be made to a thickness or diameter of several dozen μm, and a thickness several times or several dozen times that of the source electrode 3a or the gate electrode 3b. The thicker the bump, the more difficult it is to melt so there is virtually no worry of destroying the MOSFET cells on the underlayer. The surface portion irradiated by the laser beam becomes hottest but the temperature is less prone to rise the farther the distance from the surface portion. Thus it can be easily to be made a state where the surface portion of the bump 30 melts and the lower portion (the side connecting to the source electrode 3a) does not melt. Even if the source pad 4a is the same material as the bump 30 (for example, Cu and Cu), the bump 30 and the source pad 4a melt in the portion around the first connection hole 5a and a state is formed where the lower portion of the bump 30 does not melt. The melt prevention layer may be formed on the surface of the bump 30. For example, the source pad 4a is formed of Cu—Ni cladding material, and the bump 30 is formed of the combination of solder as the base material which is coated with Cu material as the melt prevention layer may be utilized. By using the bump 30, there are no particular restrictions on the surface material of the source electrode 3a which can be made from a material that melts easier than the source pad 4a. However if the same material as the melt prevention layer formed on the surface of the bump 30 is also formed on the surface of the source electrode 3a, then not only the melting of the source electrode 3a can be prevented but also the bump 30 and source electrode 3a will have good mutual affinity. Utilizing the bump 30 allows further increasing the combination of selectable materials, increasing the productivity, and expanding the design possibilities of the semiconductor device.

Although the above invention was described in connection with several preferred embodiments thereof, it will be appreciated by those skilled in the art that those embodiments are provided solely for illustrating the invention and should not be relied upon to construe the appended claims in a limiting sense. For example, the semiconductor chip 3 is not limited to a vertical MOSFET and may be an LSI such as a microcomputer, memory, and/or a high-power device such as a thyristor or insulated gate bipolar transistor (IGBT), and there are no particular restrictions on the semiconductor chip 3 for use. The numbers of the connection holes, the welded zones, clips and the bumps are not limited to the above description and may be modified and changed.

What is claimed is:

1. A semiconductor device comprising:
a semiconductor chip containing a first connection electrode formed on a top surface thereof; and
a first external lead including a first connection pad formed with a first connection hole,
wherein the first connection hole overlaps the first connection electrode, and a melting section which is a melted portion of the first connection pad is welded to the first connection electrode in a portion around the first connection hole, and
the melting point of the first connection pad is lower than that of the first connection electrode so that the first connection electrode is not melted,
wherein the first connection electrode includes an underlayer and a melt prevention layer formed above that underlayer.

2. A semiconductor device comprising:
a semiconductor chip containing a first connection electrode formed on a top surface thereof; and
a first external lead including a first connection pad formed with a first connection hole,
wherein the first connection hole overlaps the first connection electrode, and a melting section which is a melted portion of the first connection pad is welded to the first connection electrode in a portion around the first connection hole, and
the melting point of the first connection pad is lower than that of the first connection electrode so that the first connection electrode is not melted,
wherein the first connection pad contains a base material and a melt accelerator layer formed on a top surface of the base material.

* * * * *

UNITED STATES PATENT AND TRADEMARK OFFICE
CERTIFICATE OF CORRECTION

PATENT NO. : 8,299,620 B2
APPLICATION NO. : 12/163055
DATED : October 30, 2012
INVENTOR(S) : Tanaka et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1136 days.

Signed and Sealed this
Twelfth Day of March, 2013

Teresa Stanek Rea
*Acting Director of the United States Patent and Trademark Office*